(12) United States Patent
Kautzsch

(10) Patent No.: US 9,559,238 B2
(45) Date of Patent: Jan. 31, 2017

(54) ARRANGEMENT AND METHOD FOR DETERMINING THE SPATIAL DIRECTION OF RADIATION INCIDENCE

(71) Applicant: Infineon Technologies Dresden GmbH, Dresden (DE)

(72) Inventor: Thoralf Kautzsch, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 221 days.

(21) Appl. No.: 14/272,588

(22) Filed: May 8, 2014

(65) Prior Publication Data

US 2015/0323381 A1  Nov. 12, 2015

(51) Int. Cl.
*G01J 1/16* (2006.01)
*H01L 27/144* (2006.01)
*H01L 31/0216* (2014.01)
*H01L 31/18* (2006.01)
*H01L 31/10* (2006.01)
*G01S 3/783* (2006.01)

(52) U.S. Cl.
CPC ............ *H01L 31/10* (2013.01); *G01J 1/1626* (2013.01); *G01S 3/783* (2013.01); *H01L 27/1443* (2013.01); *H01L 27/1446* (2013.01); *H01L 31/02164* (2013.01); *H01L 31/18* (2013.01)

(58) Field of Classification Search
CPC ........... G01J 1/16; G01J 1/1626; H01L 31/18; H01L 31/02164; H01L 31/0216; H01L 27/1443; H01L 27/144
See application file for complete search history.

(56) References Cited

U.S. PATENT DOCUMENTS 4,970,382 A * 11/1990 Yamazaki ......... H01L 31/02164
250/214 R
5,134,081 A * 7/1992 Yamazaki ......... H01L 31/02164
257/E31.062

(Continued)

OTHER PUBLICATIONS

Sato, et al. "Fabrication of Silicon-on-Nothing Structure by Substrate Engineering Using the Empty-Space-in-Silicon Formation Technique." Japanese Journal of Applied Physics vol. 43, No. 1, 2004, pp. 12-18.

(Continued)

*Primary Examiner* — John Lee
(74) *Attorney, Agent, or Firm* — Eschweiler & Associates, LLC

(57) ABSTRACT

The present disclosure relates to an optical receiver. The optical receiver has a first photosensor and a second photosensor disposed within a substrate. The first photosensor has a first angled surface located on a first side of a depression within the substrate, and the second photosensor has a second angled surface located on a second side of the depression, opposite the first side of the depression. A plurality of blocking structures are disposed over the substrate. The plurality of blocking structures block radiation that is not incident on the first and second angled surfaces. By receiving incident radiation on the first and second angled surfaces, the first and second photosensors are able to generate directional-dependent photocurrents that vary depending upon an angle of incident radiation. Based upon the directional-dependent photocurrents, an angle of incident radiation can be determined.

20 Claims, 5 Drawing Sheets

(56) References Cited

U.S. PATENT DOCUMENTS

| | | | |
|---|---|---|---|
| 6,380,604 B1* | 4/2002 | Shima | B82Y 10/00 257/184 |
| 6,939,015 B2* | 9/2005 | Hodge | H01L 31/02164 257/E31.122 |
| 8,502,130 B2* | 8/2013 | Tay | H01L 27/14621 250/208.1 |
| 8,901,480 B2* | 12/2014 | Michiyama | G01J 1/0266 250/216 |
| 9,040,331 B2* | 5/2015 | Lochtefeld | H01L 33/06 257/13 |
| 9,116,046 B2* | 8/2015 | Fant | G01J 1/44 |
| 9,212,992 B2* | 12/2015 | McNutt | G01N 21/55 |
| 9,287,383 B2* | 3/2016 | Schmidt | H01L 21/26586 |
| 9,305,952 B2* | 4/2016 | Lenchenkov | H01L 31/02164 |
| 9,318,516 B2* | 4/2016 | Pagani | H01L 27/14 |
| 2002/0020892 A1* | 2/2002 | Shima | B82Y 10/00 257/432 |
| 2007/0237888 A1* | 10/2007 | Liu | H01L 27/14621 427/58 |
| 2008/0075474 A1* | 3/2008 | Kawai | H01L 27/144 398/208 |
| 2010/0265384 A1* | 10/2010 | Tay | H01L 27/14621 348/336 |
| 2013/0037700 A1* | 2/2013 | Michiyama | G01J 1/0266 250/208.2 |
| 2013/0062502 A1* | 3/2013 | Kautzsch | H01L 31/062 250/206 |
| 2013/0155396 A1* | 6/2013 | Deliwala | G01J 1/0242 356/138 |
| 2014/0001521 A1* | 1/2014 | Pagani | H01L 31/105 257/290 |
| 2014/0285755 A1* | 9/2014 | Kurokawa | G02F 1/133514 349/106 |
| 2015/0179833 A1* | 6/2015 | Kautzsch | H01L 31/062 356/402 |
| 2015/0323381 A1* | 11/2015 | Kautzsch | G01J 1/1626 250/208.2 |

OTHER PUBLICATIONS

Campbell, et al. "High Performance Light Trapping Textures for Monocrystalline Silicon Solar Cells." Solar Energy Materials & Solar Cells 65 (2001) 369-375.

* cited by examiner

ARRANGEMENT AND METHOD FOR DETERMINING THE SPATIAL DIRECTION OF RADIATION INCIDENCE

BACKGROUND

Optical receivers are used in wide range of modern electronic devices to detect and convert optical signals (e.g., light and/or other electromagnetic radiation having a wavelength less than that of radio waves) to electrical signals. For example, optical receivers may be used in such applications as communication systems, motion sensors, automotive sensors, telescopes, etc. Optical receivers typically comprise a photosensor (e.g., a PN junction, a PIN diode, an avalanche photodetector, etc.) disposed within a semiconductor substrate. Optical signals (e.g., photons) hitting a surface of the semiconductor substrate will cause the photosensor will generate a number of charge carriers (e.g., holes or electrons) proportional to the amplitude of the optical signal.

DETAILED DESCRIPTION

Figure 1:
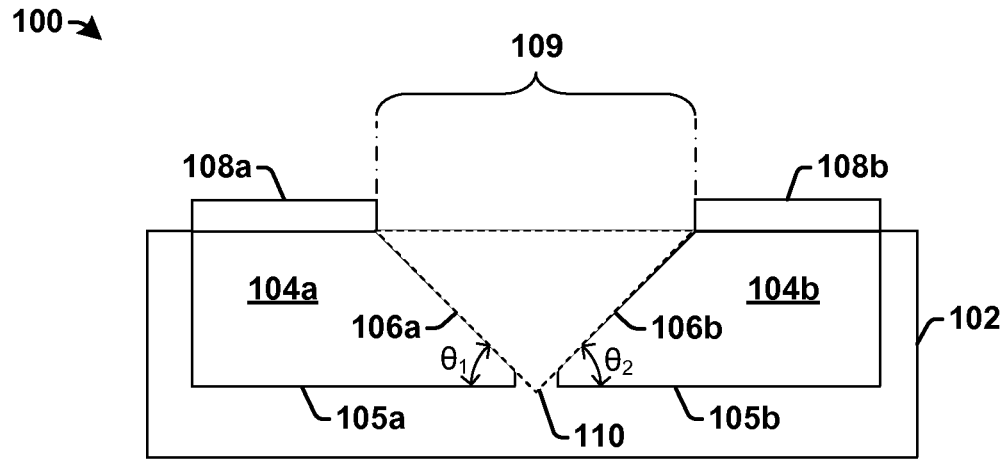
FIG. 1 is a block diagram of some embodiments of a cross-sectional view of an optical receiver configured to provide directional identification of incident radiation.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Optical receivers are often used to determine brightness and/or the color of incident electromagnetic radiation. Besides such customary functions, some optical receivers may also be configured to provide direction identification of incident electromagnetic radiation by determining a direction from which a main proportion of incident electromagnetic radiation impinges on the optical receiver.

One method for performing directional identification of incident electromagnetic radiation is through the use of a shadow diaphragm. A shadow diaphragm comprises a plurality of stacked metal interconnect layers located at a position between two underlying adjacent photosensors disposed within a substrate. If electromagnetic radiation is incident upon the substrate at an angle, the shadow diaphragm is configured to block a portion of the electromagnetic radiation from reaching one of the adjacent photosensors, so that the two photosensors generate different photocurrents depending upon the angle.

While shadow diaphragms provide for an assessment of the spatial direction of incident electromagnetic radiation, the quality of the assessment depends on a ratio of a height of the shadow diaphragm and a size of the adjacent photosensors. For example, if a large number of metal interconnect layers are not offered or if the adjacent photosensors have a large area, the quality of the assessment may be poor. Reflections from the stacked metal interconnect layers may also impair the assessment, further contributing to poor performance of the optical receiver.

Accordingly, the present disclosure relates to an optical receiver with a simple structure and good performance. The optical receiver comprises a first photosensor and a second photosensor disposed within a substrate. The first photosensor has a first angled surface located on a first side of a depression within the substrate, and the second photosensor has a second angled surface located on a second side of the depression, opposite the first side of the depression. A plurality of blocking structures are disposed over the substrate. The plurality of blocking structures are configured to block radiation that is not incident on the first and second angled surfaces. By receiving incident radiation on the first and second angled surfaces, the first and second photosensors are able to generate directional-dependent photocurrents that vary depending upon an angle of incident radiation. Based upon the directional-dependent photocurrents, an angle of incident radiation can be determined.

FIG. 1 is a block diagram of some embodiments of a cross-sectional view of an optical receiver 100 configured to provide directional identification of incident radiation.

The optical receiver 100 comprises a substrate 102 having a first photosensor 104a and a second photosensor 104b. The first and second photosensors, 104a and 104b, are configured to convert optical signals (e.g., light and/or other electromagnetic radiation having a wavelength less than that of radio waves) to directional-dependent photocurrents that vary depending upon an angle of incident radiation.

In some embodiments, the first and second photosensors, 104a and 104b, respectively comprise angled surfaces, 106a and 106b, facing a depression 110 within the substrate 102. The depression 110 is disposed laterally between the first and second photosensors, 104a and 104b, so that the first angled surface 106a is located on a first side of the depression 110 and the second angled surface 106b is located on a second side of the depression 110, which is opposite the first side of the depression 110. In some embodiments, the depression 110 may comprise angled surfaces, 106a and 106b, having a constant slope (e.g., the depression 110 may comprise an inverted triangular shape). In other embodiments, the depression 110 may comprise angled surfaces, 106a and 106b, having a slope that varies as a function of position (e.g., the depression 110 may comprise a bowl shape).

In some embodiments, the first angled surface 106a of the first photosensor 104a is separated from a bottom surface 105a of the first photosensor 104a by a first angle $\theta_{1i}$ and the second angled surface 106b of the second photosensor 104b is separated from a bottom surface 105b of the second photosensor 104b by a second angle $\theta_2$. In some embodiments, the first angle $\theta_1$ is equal to the second angle $\theta_2$, so that the first and second angled surfaces, 106a and 106b, are a mirror image of one another.

A plurality of blocking structures, 108a and 108b, are disposed over the substrate 102 at a position overlying the first and second photosensors, 104a and 104b. The plurality of blocking structure, 108a and 108b, define an opening 109 that allows for incident radiation to be selectively provided to the first and second photosensors, 104a and 104b, depending upon an angle of incident radiation. In other words, the plurality of blocking structures, 108a and 108b, define an opening 109 that will vary an amount of incident radiation provided to the first and/or second photosensor, 104a and/or 104b, depending upon an angle of incident radiation.

In some embodiments, the plurality of blocking structures comprise a first blocking structure 108a and a second blocking structure 108b. The first blocking structure 108a is configured to block radiation that is not incident on the first angled surface 106a of the first photosensor 104a (e.g., to block radiation from a top surface of the first photosensor 104a). The second blocking structure 108b is configured to block radiation that is not incident on the second angled surface 106b of the second photosensor 104b (e.g., to block radiation from a top surface of the second photosensor 104b).

Figure 2:
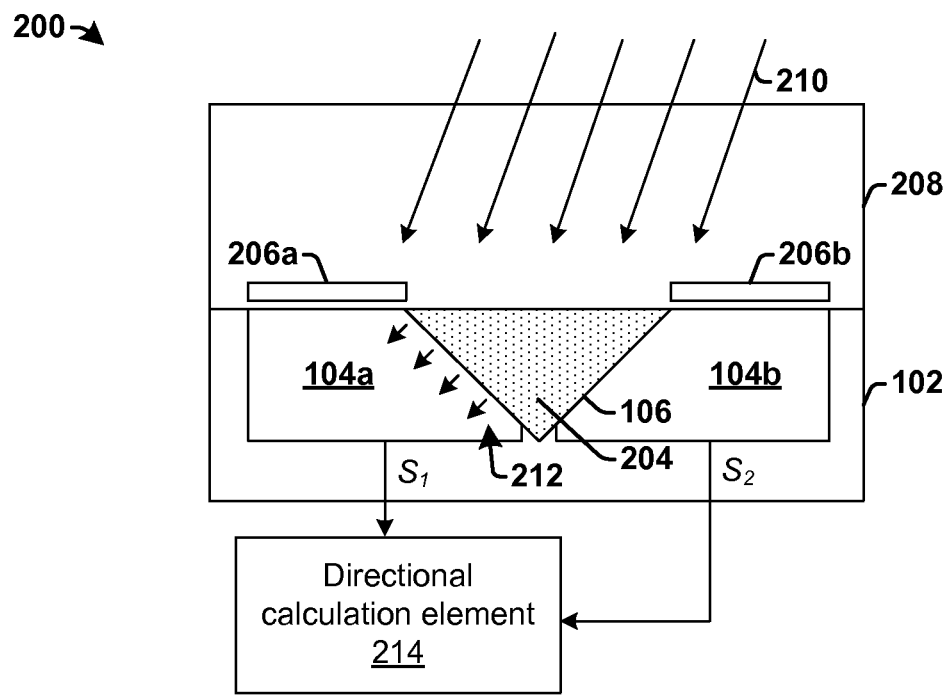
FIG. 2 is a block diagram of some additional embodiments of a cross-sectional view of an optical receiver configured to provide directional identification of incident radiation.

FIG. 2 is a block diagram of some additional embodiments of a cross-sectional view of an optical receiver 200 configured to provide directional identification of incident radiation.

The optical receiver 200 comprises a first photosensor 104a and a second photosensor 104b disposed within a substrate 102. In some embodiments the first and second photosensors, 104a and 104b, may comprise CMOS image sensors, photodiodes (e.g., a PIN photodiode or a PN junction), etc. In various embodiments, the substrate 102 may comprise any type of semiconductor body (e.g., silicon, silicon-germanium, silicon-on-insulator, III-V materials, etc.) such as a semiconductor wafer and/or one or more die on a semiconductor wafer, as well as any other type of semiconductor and/or epitaxial layers associated therewith.

An insulating structure 204 is disposed within a depression in the substrate 102 at a position that is laterally between the first photosensor 104a and the second photosensor 104b. In some embodiments, the insulating structure 204 may have a wedge-shape or an inverted triangle shape (i.e., an inverted prism shape) that increases in width as a distance from a top surface of the substrate 102 decreases. In some embodiments, the insulating structure 204 abuts the angled surfaces 106 of the first and second photosensors, 104a and 104b. In other embodiments, the insulating structure 204 is separated from the angled surfaces 106 of the first and second photosensors, 104a and 104b, by a portion of the substrate 102. In some embodiments, the insulating structure 204 may comprise silicon dioxide.

First and second blocking structures, 206a and 206b, are disposed within an inter-level dielectric (ILD) layer 208 overlying the substrate 102. The first and second block structures, 206a and 206b, are located at positions overlying the first and second photosensors, 104a and 104b, respectively. In some embodiments, the first and second blocking structures, 206a and 206b, may comprise one or more back-end-of-the-line (BEOL) metal interconnect layers (e.g., copper and/or aluminum metal interconnect layers formed by a damascene or a non-damascene process). In other embodiments, the first and second blocking structures, 206a and 206b, may comprise other materials disposed within an isolating layer overlying the first and second photosensors, 104a and 104b.

A directional calculation element 214 is in communication with the first and second photosensors, 104a and 104b. The directional calculation element 214 is configured to receive a first signal $S_1$ (e.g., a first photocurrent) from the first photosensor 104a and a second signal $S_2$ (e.g., a second photocurrent) from the second photosensor 104b. The first signal $S_1$ is indicative of an amount of radiation received at the first photosensor 104a, and the second signal $S_2$ is indicative of an amount of radiation received at the second photosensor 104b. The directional calculation element 214 is configured to perform a comparative assessment of the first and second signals, $S_1$ and $S_2$, and based thereupon to calculate an angle of incident radiation. For example, in some embodiments, the directional calculation element 214 may be configured to calculate a ratio of the first and second signals, $S_1$ and $S_2$, (i.e., a ratio incident radiation received by the first photosensor 104a and the second photosensor 104b) and from the ratio to determine a direction of incident radiation.

Figure 3A:
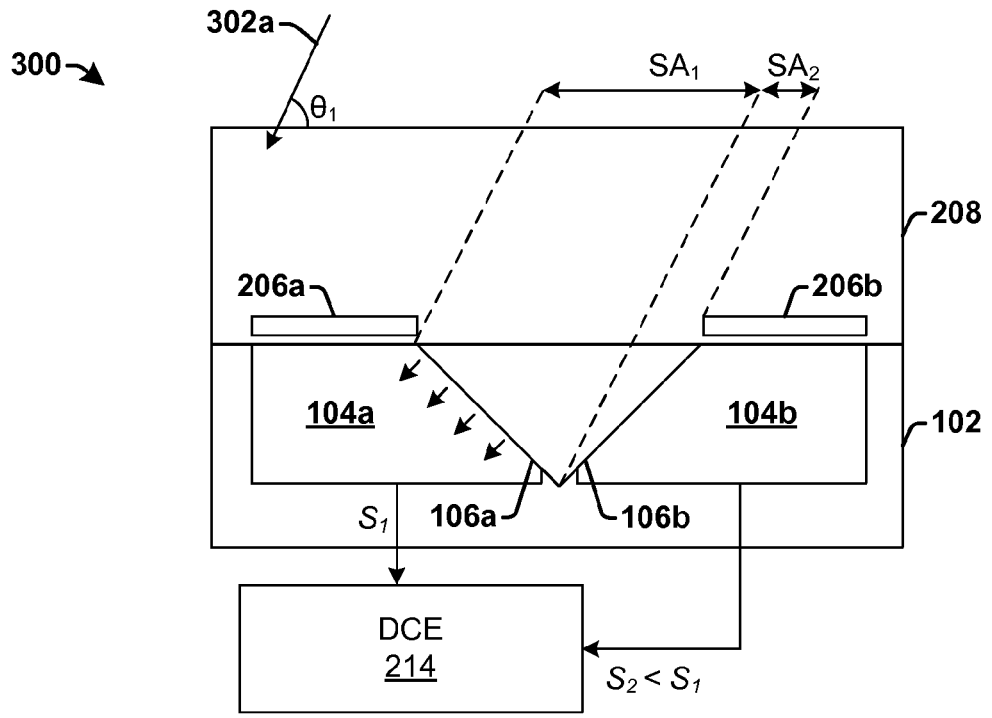
FIGS. 3A-3B are block diagrams showing operation of a disclosed optical receiver configured to provide directional identification of incident radiation.
Figure 3B:
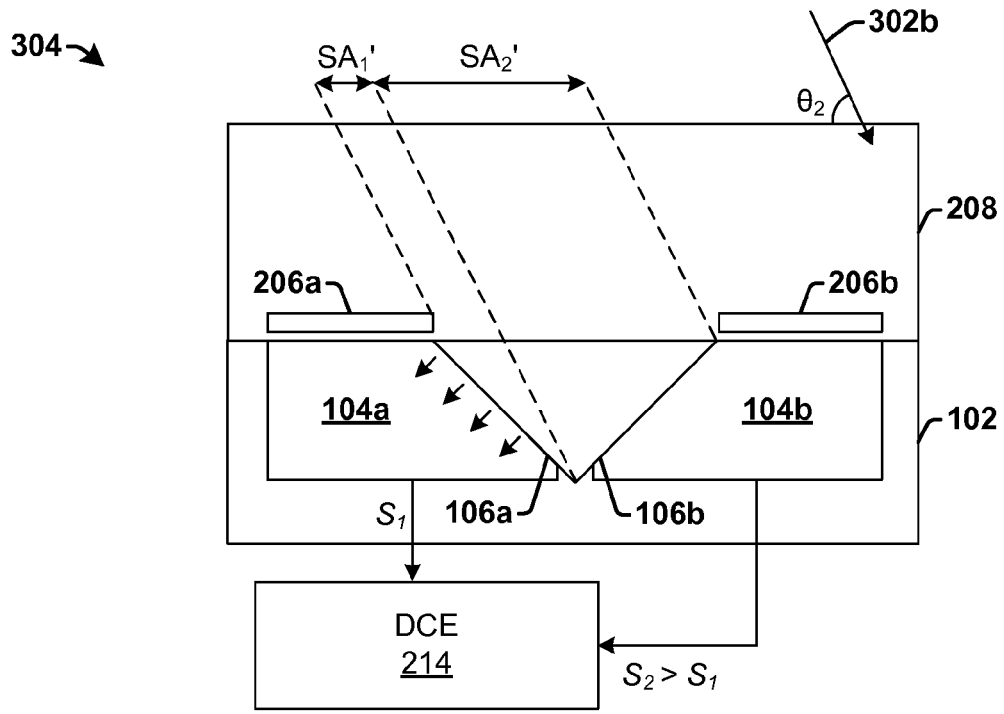

FIGS. 3A-3B are block diagrams, 300 and 304, showing operation of a disclosed optical receiver configured to provide directional identification of incident radiation.

As shown in cross-sectional view 300, electromagnetic radiation 302a is incident upon the optical receiver at a first angle $\phi_1$. The first angle $\phi_1$ causes the first photosensor 104a to have a first surface area $SA_1$ exposed to the electromagnetic radiation 302a. The first angle $\phi_1$ also causes the second photosensor 104b to have a second surface area $SA_2$ exposed to the electromagnetic radiation 302a, wherein the second surface area $SA_2$ is smaller than the first surface area $SA_1$. Since the second surface area $SA_2$ is smaller than the first surface area $SA_1$, the second photosensor 104b will receive less electromagnetic radiation 302a than the first photosensor 104a, causing the second photosensor 104b to generate a second signal $S_2$ that is smaller than a first signal $S_1$ generated by the first photosensor 104a. The first signal $S_1$ and the second signal $S_2$ are provided to a directional calculation element 214. The directional calculation element 214 is able to calculate the first angle $\phi_1$ of the incident electromagnetic radiation 302a based upon the first and second signals, $S_1$ and $S_2$.

As shown in cross-sectional view 304, electromagnetic radiation 302b is incident upon the optical receiver at a second angle $\phi_2$. The second angle $\phi_2$ causes the first photosensor 104a to have a first surface area $SA_1'$ exposed to the electromagnetic radiation 302b. The second angle $\phi_2$ also causes the second photosensor 104b to have a second surface area $SA_2'$ exposed to the electromagnetic radiation 302, wherein the second surface area $SA_2'$ is larger than the first surface area $SA_1'$. Since the second surface area $SA_2'$ is larger than the first surface area $SA_1'$, the second photosensor 104b will receive more electromagnetic radiation 302b than the first photosensor 104a, causing the second photosensor 104b to generate a second signal $S_2$ that is larger than a first signal $S_1$ generated by the first photosensor 104a. The first signal $S_1$ and the second signal $S_2$ are provided to the directional calculation element 214. The directional calculation element 214 is able to calculate the second angle $\phi_2$ of the incident electromagnetic radiation 302b based upon the first and second signals, $S_1$ and $S_2$.

Figure 4:
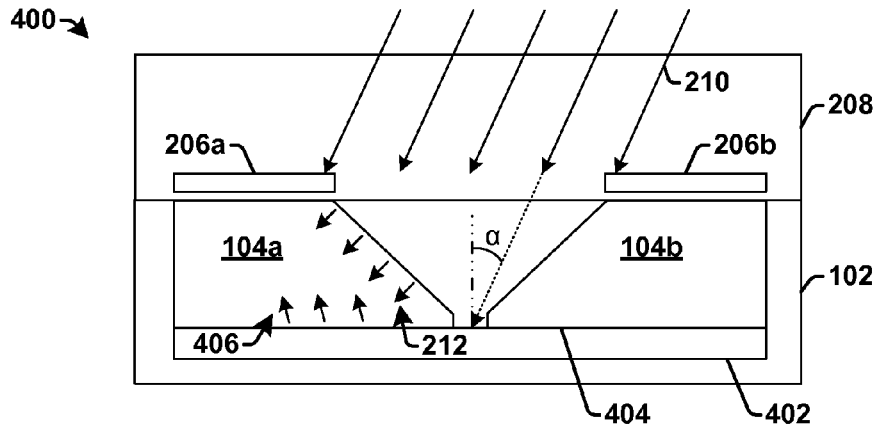
FIG. 4 is a block diagram of some additional embodiments of a cross-sectional view of a disclosed optical receiver having a light trap.

FIG. 4 is a block diagram of some additional embodiments of a cross-sectional view of a disclosed optical receiver 400 having a light trap.

The optical receiver 400 comprises a light trap 402 disposed below the first and second photosensors, 104a and 104b, so that the first and second photosensors, 104a and 104b, are disposed between a top surface of the substrate 102 and the light trap 402. An interface 404 is located between the light trap 402 and the first and second photosensors, 104a and 104b. The light trap 402 has a different index of refraction than the first and second photosensors, 104a and 104b. For example, in some embodiments, the light trap 402 may comprise a planar cavity located below the first and second photosensors, 104a and 104b.

The different index of refraction between the light trap 402 and the first and second photosensors, 104a and 104b, causes the interface 404 to reflect incident radiation 210 in a manner that generates reflected radiation 406 that may be disproportionately provided to the first photosensor 104a or the second photosensor 104b depending upon an angle of incident radiation 210. For example, incident radiation 210 is illustrated as being incident on the interface 404 of the light trap 402 at the angle α relative to a normal of the substrate 102. The incident radiation is reflected at an angle of −α relative to the normal. Due to the position of the blocking structures, 206a and 206b, more reflected radiation 406 is provided to the first photosensor 104a than the second photosensor 104b, thereby enhancing the difference between signals generated by the first and second photosensors, 104a and 104b (i.e., since radiation is reflected at an angle of refraction equal to an angle of incidence, the reflected radiation 406 will be disproportionately provide to the first photosensor 104a).

It will be appreciated that the disclosed optical receiver (e.g., 100, 200, 400, etc.) may be comprised within a plurality of different electronic devices. For example, in some embodiments, the disclosed optical receiver may be comprised within a tracking device of photovoltaic and/or dish Stirling installations. In other embodiments, the disclosed optical receiver may be comprised within a digital camera to enable a fast phase autofocus functionality.

Figure 5:
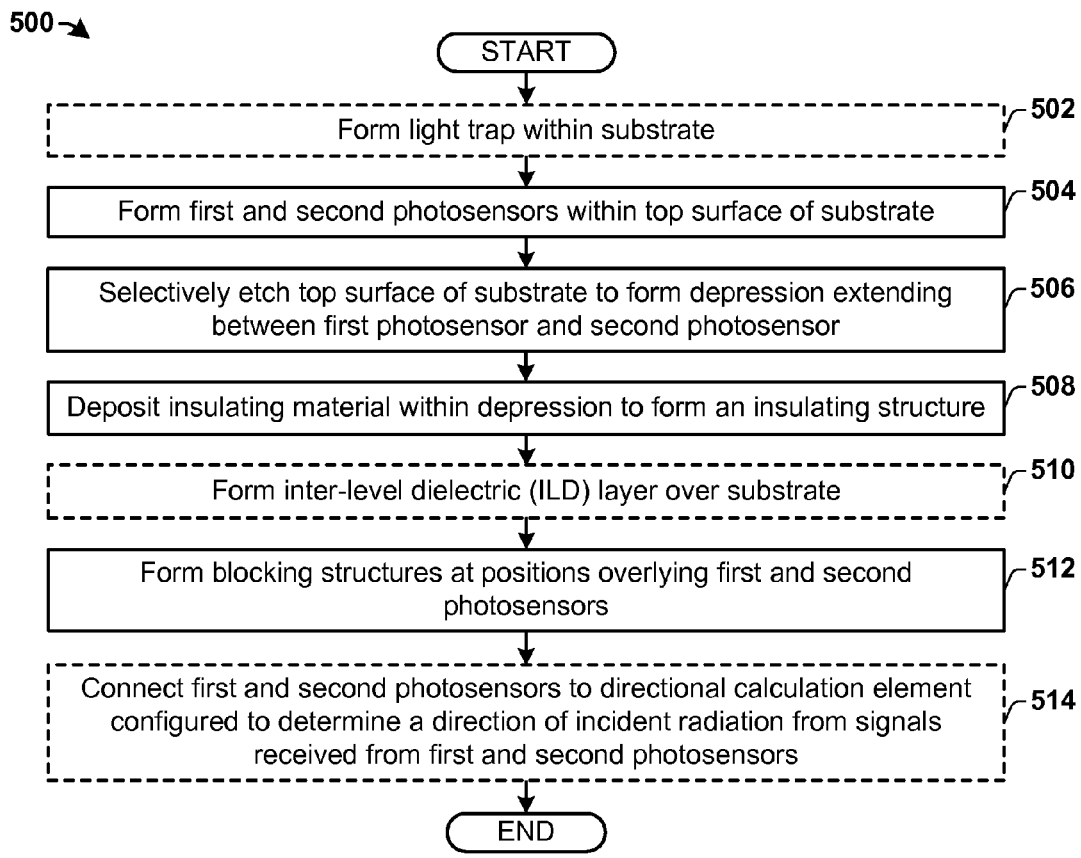
FIG. 5 is a flow diagram of some embodiments of a method of forming an optical receiver configured to provide directional identification of incident radiation.

FIG. 5 is a flow diagram of some embodiments of a method 500 of forming an optical receiver configured to provide directional identification of incident radiation.

It will be appreciated that while method 500 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 502, a light trap may be formed within a substrate, in some embodiments. The light trap comprises an area disposed within the substrate that has a different index of refraction than the surrounding substrate.

At 504, first and second photosensors are formed within a top surface of the substrate. In some embodiments, the first and second photosensors may abut a top surface of the light trap at an interface, so that the first and second photosensors are disposed between the top surface of the substrate and the top surface of the light trap.

At 506, the top surface of the substrate is selectively etched to form a depression that extends between the first photosensor and the second photosensor. The depression causes the first and second photosensors to have angled surfaces, which are located on opposite sides of the depression. In some embodiments, the angled surfaces may cause the depression to form an inverted triangular shape (i.e., an inverted prism shape).

At 508, an insulating material is deposited within the depression to form an insulating structure.

At 510, an inter-level dielectric (ILD) layer may be formed over the substrate, in some embodiments.

At 512, a plurality of blocking structures are formed over the substrate at positions overlying the first and second photosensors. The plurality of blocking structures define an opening that allows for incident radiation to be disproportionately provided to the first and/or second photosensors depending upon an angle of incident radiation. In some embodiments, the plurality of blocking structures mask the top surface of the first and second photosensors, so that incident radiation will be received by the angled surfaces of the first and second photosensors.

At 514, the first and second photosensors may be connected to a directional calculation element configured to determine a direction of incident radiation from signals received from the first and second photosensors, in some embodiments. In some embodiments, the directional calculation element is configured to calculate a ratio of incident radiation received by the first photosensor and the second photosensor, and from the ratio to determine a direction of incident radiation.

FIGS. 6-10 illustrate cross-sectional views of various stages of forming an optical receiver configured to provide directional identification of incident radiation. Although FIGS. 6-10 are described in relation to method 500, it will be appreciated that the structures disclosed in FIGS. 6-9 are not limited to such a method, but instead may stand alone as apparatus.

Figure 6:
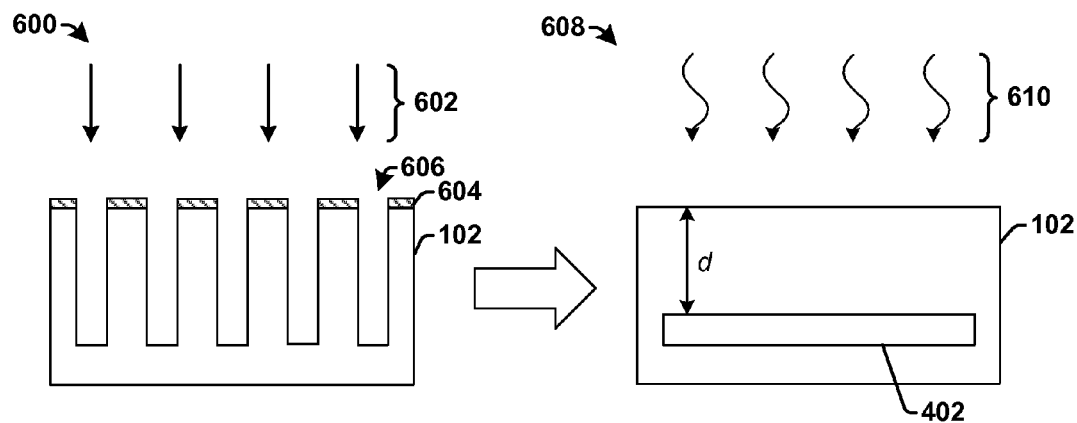
FIGS. 6-10 illustrate cross-sectional views of various stages of forming an optical receiver configured to provide directional identification of incident radiation.

FIG. 6 illustrates cross-sectional views, 600 and 608, of some embodiments of a semiconductor substrate corresponding to act 502. Although cross-sectional views, 600 and 608, illustrate the formation of a light trap by use of a Venezia process, it will be appreciated that formation of the light trap is not limited to such processes.

As shown in cross-sectional view 600, a plurality of trenches 606 are formed within a top surface of a substrate 102. In some embodiments, the plurality of trenches 606 are formed by selectively forming a masking layer 604 (e.g., $SiO_2$) onto the top surface of the substrate 102 in a pattern that defines the plurality of trenches 606. The substrate 102 is then exposed to an etchant 602, which is configured to etch the substrate 102 in areas not covered by the masking layer 604. In some embodiments, the etchant 602 may comprise a dry etchant (e.g., an RIE etchant, a plasma etchant, etc.) configured to generate trenches 606 with vertical sidewalls.

As shown in cross-sectional view 608, the substrate 102 is subsequently exposed to a non-oxidizing environment 610 (i.e., an environment substantially devoid of oxygen) having an elevated temperature. In some embodiments, the elevated temperature may be greater than or equal to approximately 800° C. In some e additional embodiments, the evaluated temperature may be greater than or equal to approximately 1100° C. The elevated temperature of the non-oxidizing environment 610 causes reflow of material of the substrate 102 to close the plurality of trenches 606 and to form a light trap 402 comprising a cavity within the substrate 102. The light trap has a different index of refraction than the substrate 102, and is separated from a top surface of the substrate 102 by a depth d.

Figure 7:
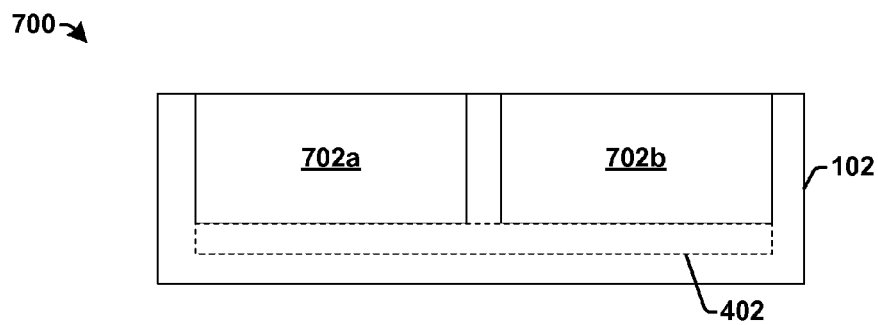

FIG. 7 illustrates a cross-sectional view 700 of some embodiments of a semiconductor substrate corresponding to act 504.

As shown in cross-sectional view 700, first and second photosensors, 702a and 702b, are formed within a top surface of the substrate 102. In various embodiments, the first and second photosensors, 702a and 702b, may comprise CMOS image sensors, photodiodes (e.g., a PIN photodiode or a PN junction), etc. It will be appreciated that the first and second photosensors, 702a and 702b, may be formed by various methods used by one of ordinary skill in the art and will depend upon a type of photosensor formed and characteristics of the photosensor. For example, in some embodiments, the first and second photosensors, 702a and 702b, comprising PN junctions may be formed by selectively implanting p-type dopants and n-type dopants into the top surface of the substrate 102.

Figure 8:
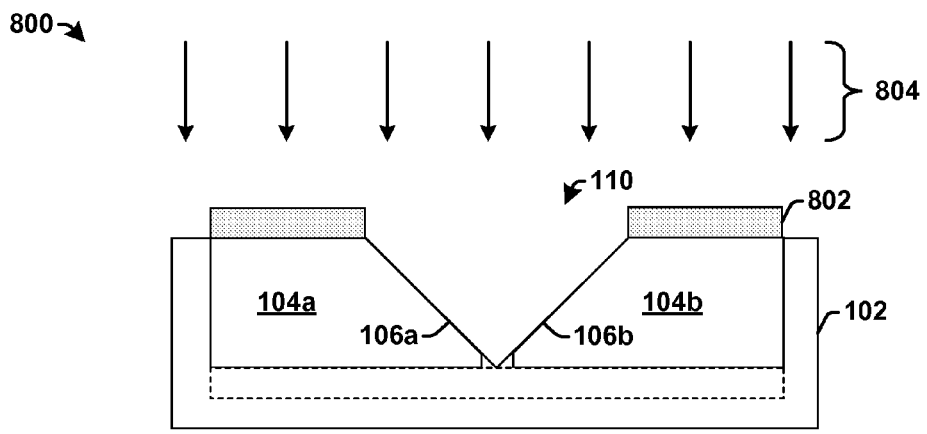

FIG. 8 illustrates a cross-sectional view 800 of some embodiments of a semiconductor substrate corresponding to act 506.

As shown in cross-sectional view 800, a masking layer 802 is selectively formed over the substrate 102. The substrate 102 is then exposed to an etchant 804 that is configured to etch the substrate 102 in areas not covered by the masking layer 802. The etchant 804 is configured to remove a portion of the substrate 102 comprising the first and second photosensors, 702a and 702b, so as to cause the resulting photosensors, 104a and 104b, to respectively have angular surfaces, 106a and 106b, on opposite sides of a depression 110 in the substrate 102. The depression 110 extends between the first photosensor 702a and the second photosensor 702b.

In some embodiments, the masking layer 802 may comprise a hard mask (e.g., silicon-oxide, silicon-nitride, silicon-oxynitride, silicon-carbide, etc.). In some embodiments, etchant 804 may comprise a wet etchant having an alkaline solution configured to define surfaces of the depression 110 as <111> planes, which give the depression 110 an inverted triangular shape. For example, the substrate 102 may be immersed in an etchant 804 comprising an alkaline solution (e.g., a bath of Tetramethylammonium hydroxide (TMAH), potassium hydroxide (KOH), etc.).

Figure 9:
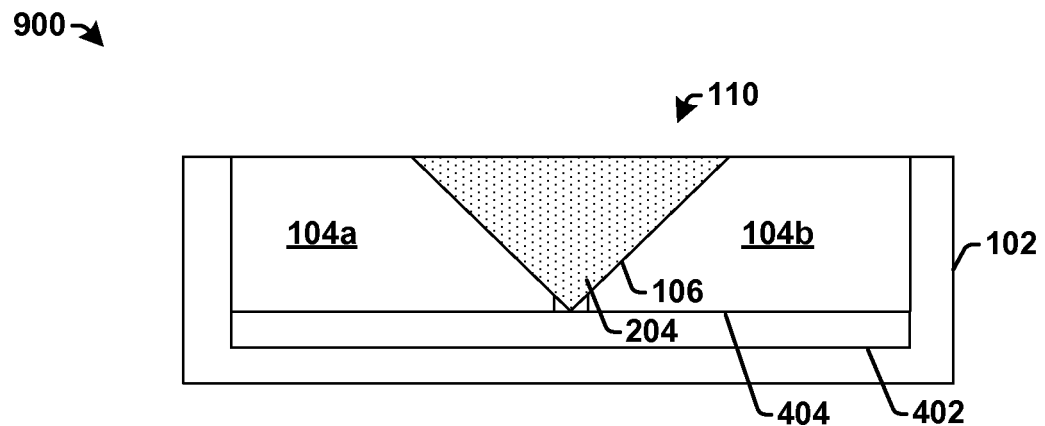

FIG. 9 illustrates a cross-sectional view 900 of some embodiments of a semiconductor substrate corresponding to act 508.

As shown in cross-sectional view 900, the depression 110 is filled with an insulating material to form an insulating structure 204 disposed between the first photosensor 104a and the second photosensor 104b. The insulating structure 204 forms a planar surface with the top of the substrate 102, so that additional processing steps can be performed. In some embodiments, the insulating material may comprise silicon dioxide. In such embodiments, the silicon dioxide may be formed within the depression 110 using a vapor deposition technique (e.g., physical vapor deposition, chemical vapor deposition, etc.).

Figure 10:
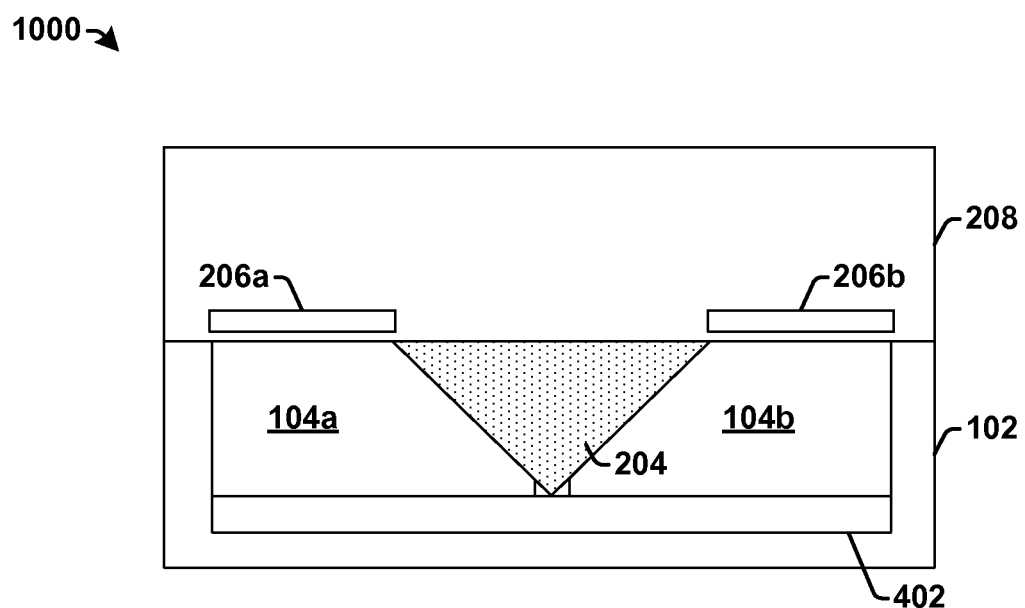

FIG. 10 illustrates a cross-sectional view 1000 of some embodiments of a semiconductor substrate corresponding to acts 510-512.

As shown in cross-sectional view 1000, a plurality of blocking structures, 206a and 206b, are formed over the substrate 102. In some embodiments, the plurality of blocking structures, 206a and 206b, comprise a back-end-of-the-line (BEOL) metal interconnect layer surrounded by an inter-level dielectric (ILD) layer 208. In such embodiments, the plurality of blocking structures, 206a and 206b, may be formed by depositing a metal layer over a lower layer of isolating material (e.g., a lower section of the ILD layer 208), and by subsequently forming an upper layer of isolating material (e.g., an upper section of the ILD layer 208) over the metal layer.

In some embodiments, the plurality of blocking structures, 206a and 206b, may be formed using a damascene process in which the ILD layer 208 is deposited onto the substrate 102. In such embodiments, the ILD layer 208 may comprise low-k dielectric material (e.g., SiCO) or an ultra low-k dielectric material, deposited by a vapor deposition technique (e.g., physical vapor deposition, chemical vapor deposition, etc.). An etching process is then performed to form openings within the ILD layer 208. The openings are subsequently filled with a metal (e.g., copper, aluminum, etc.) to form the plurality of blocking structures, 206a and 206b, and an overlying dielectric layer may be formed over the metal. In other embodiments, the plurality of blocking structures, 206a and 206b, may be formed by using a non-damascene process (i.e., a process that does not fill an etched dielectric layer with a metal material).

It will be appreciated that equivalent alterations and/or modifications may occur to those skilled in the art based upon a reading and/or understanding of the specification and annexed drawings. The disclosure herein includes all such modifications and alterations and is generally not intended to be limited thereby. For example, although the disclosed system is illustrated as having two offset correction circuits and two feedback loops, one of ordinary skill in the art will appreciate that a disclosed system may comprise more than two offset correction circuits and/or feedback loops.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions

What is claimed is:

1. An optical receiver, comprising:
   a first photosensor disposed within a substrate and having a first angled surface located on a first side of a depression within the substrate, wherein the first angled surface is angled at a first obtuse angle with respect to a part of a top surface of the substrate over the first photosensor;
   a second photosensor disposed within the substrate and having a second angled surface located on a second side of the depression, opposite the first side of the depression, wherein the second angled surface is angled at a second obtuse angle with respect to a part of the top surface of the substrate over the second photosensor; and
   a plurality of blocking structures disposed over the top surface of the substrate and configured to block radiation that is not incident on either the first angled surface or the second angled surface.

2. The optical receiver of claim 1, further comprising:
   an insulating structure having a triangular shape disposed within the depression at a position laterally between the first photosensor and the second photosensor.

3. The optical receiver of claim 2, wherein the insulating structure abuts the first angled surface of the first photosensor and the second angled surface of the second photosensor.

4. The optical receiver of claim 2, wherein the insulating structure comprises silicon dioxide.

5. The optical receiver of claim 2,
   wherein the insulating structure is separated from the first angled surface of the first photosensor by a first portion of the substrate; and wherein the insulating structure is separated from the second angled surface of the second photosensor by a second portion of the substrate.

6. The optical receiver of claim 1, further comprising:
a planar cavity disposed within the substrate at a position that is vertically below the first photosensor and the second photosensor, wherein an interface between the planar cavity and the first and second photosensors is configured to reflect electromagnetic radiation.

7. The optical receiver of claim 1, wherein the first photosensor and the second photosensor comprise CMOS (complementary metal-oxide-semiconductor) image sensors.

8. The optical receiver of claim 1,
wherein the first angled surface is angled with respect to a first bottom surface of the first photosensor at a first acute angle; and
wherein the second angled surface is angled with respect to a second bottom surface of the second photosensor at a second acute angle equal to the first acute angle.

9. The optical receiver of claim 1, wherein the plurality of blocking structures comprise back-end-of-the-line metal interconnect layers disposed within an inter-level dielectric (ILD) layer located over the substrate.

10. The optical receiver of claim 1, further comprising:
a directional calculation element configured to receive a first signal from the first photosensor, to receive a second signal from the second photosensor, and to calculate an angle of incident radiation from the first signal and the second signal.

11. An optical receiver, comprising:
a first photosensor disposed within a substrate on a first side of a depression within the substrate;
a second photosensor disposed within the substrate on a second side of the depression, opposite the first side of the depression, wherein the depression is arranged between a first surface of the substrate and a second surface of the substrate, wherein the first surface is angled with respect to an adjoining part of a top surface of the substrate at a first obtuse angle, and the second surface is angled with respect to an adjoining part of the top surface of the substrate at a second obtuse angle;
an insulating structure having a triangular shape disposed within the depression at a position laterally between the first photosensor and the second photosensor; and
one or more back-end-of-the-line metal interconnect layers disposed over the substrate and configured to block radiation that is not incident on the first angled-surface and the second surface.

12. The optical receiver of claim 11,
wherein the insulating structure is separated from the first photosensor by a first portion of the substrate; and
wherein the insulating structure is separated from the second photosensor by a second portion of the substrate.

13. The optical receiver of claim 11, further comprising:
a planar cavity disposed within the substrate at a position that is vertically below the first photosensor and the second photosensor, wherein an interface of the planar cavity and the first and second photosensors is configured to reflect electromagnetic radiation.

14. The optical receiver of claim 11, wherein the insulating structure abuts the first surface and the second surface.

15. The optical receiver of claim 11, wherein the insulating structure comprises silicon dioxide.

16. The optical receiver of claim 11, further comprising:
a directional calculation element configured to receive a first signal from the first photosensor, to receive a second signal from the second photosensor, and to calculate an angle of incident radiation from the first signal and the second signal.

17. A method of forming an optical receiver, comprising:
forming a first photosensor and a second photosensor within a top surface of a substrate;
selectively etching the top surface of the substrate to form a depression extending between the first photosensor and the second photosensor, wherein the depression is arranged between a first surface of the substrate and a second surface of the substrate, and wherein the first surface is angled with respect to an adjoining part of the top surface of the substrate at a first obtuse angle, and the second surface is angled with respect to an adjoining part of the top surface of the substrate at a second obtuse angle; and
forming a plurality of blocking structures over the top surface of the substrate, wherein the plurality of blocking structures define an opening that allows for incident radiation to be disproportionately provided to the first photosensor armor the second photosensor depending upon an angle of incident radiation.

18. The method of claim 17, further comprising:
depositing an insulating material within the depression to form an insulating structure that has an inverted triangular shape that increases in width as a distance to the top surface of the substrate decreases.

19. The method of claim 17, further comprising:
forming a light trap within the substrate at a position underlying the first photosensor and the second photosensor.

20. The method of claim 17, wherein forming a plurality of blocking structures comprises:
forming a lower layer of isolating material at a position overlying the substrate;
forming a metal layer comprising the plurality of blocking structures over the lower layer of isolating material; and
forming an upper layer of isolating material over the metal layer.

* * * * *